United States Patent [19]

Smayling

[11] Patent Number: 5,420,522
[45] Date of Patent: May 30, 1995

[54] METHOD AND SYSTEM FOR FAULT TESTING INTEGRATED CIRCUITS USING A LIGHT SOURCE

[75] Inventor: Michael Smayling, Missouri City, Tex.

[73] Assignee: Texas Instruments Incorporated, Dallas, Tex.

[21] Appl. No.: 802,165

[22] Filed: Dec. 4, 1991

[51] Int. Cl.⁶ ............................................. G01R 31/00
[52] U.S. Cl. .................................... 324/765; 324/769
[58] Field of Search ............ 324/158 R, 158 T, 158 D, 324/73.1, 765, 769, 158.1; 437/8; 371/25.1, 22.5, 22.4, 15.1

[56] References Cited

U.S. PATENT DOCUMENTS

| | | | |
|---|---|---|---|
| 3,636,450 | 1/1972 | Griffin | 324/158 T |
| 4,494,069 | 1/1985 | Lin | 324/158 R |
| 4,568,879 | 2/1986 | Nakamura et al. | 324/158 R |
| 4,710,704 | 12/1987 | Ando | 324/103 R |
| 4,736,159 | 4/1988 | Shiragasawa et al. | 324/158 D |
| 4,816,755 | 3/1989 | Look et al. | 324/158 D |
| 4,859,938 | 8/1989 | Kim et al. | 324/158 R |
| 4,947,114 | 8/1990 | Schindlbeck | 324/158 R |
| 4,965,515 | 10/1990 | Karasawa | 324/158 R |
| 4,968,932 | 11/1990 | Baba et al. | 324/158 T |
| 5,025,344 | 6/1991 | Maly et al. | 324/73.1 |
| 5,057,774 | 10/1991 | Verhelst et al. | 324/158 R |
| 5,130,643 | 7/1992 | Foell et al. | 324/158 D |

OTHER PUBLICATIONS

"On the Charge Sharing Problem in CMOS Stuck-Open Fault Testing", Jong Lee et al., 1990 IEEE International Test Conference, Paper 21.1–pp. 417–426.

*Primary Examiner*—Vinh Nguyen
*Attorney, Agent, or Firm*—Ira S. Matsil; James C. Kesterson; Richard L. Donaldson

[57] ABSTRACT

An improved $I_{CCQ}$ test method uses illumination of the integrated circuit to generate photo-induced currents and diode effects in order to detect types of circuits faults not otherwise detectable using conventional $I_{CCQ}$ testing methods.

31 Claims, 3 Drawing Sheets

METHOD AND SYSTEM FOR FAULT TESTING INTEGRATED CIRCUITS USING A LIGHT SOURCE

FIELD OF THE INVENTION

This invention generally relates to integrated circuits, and more particularly to methods of testing integrated circuits for faults.

BACKGROUND OF THE INVENTION

Detecting faults in CMOS (Complimentary Metal Oxide Silicon) ICs (Integrated Circuits) is critical to assure correct functioning of the IC during use. Common types of faults that must be detected are stuck-open or stuck-closed nodes which can adversely affect the circuit operation. FIG. 1 illustrates a typical CMOS invertor circuit formed in the active face of a semiconductor wafer. PMOS transistor 2 and NMOS transistor 4 are connected in series between power supply Vcc, typically at 5V, and power supply Vss, typically grounded at 0V. The gates of the two transistors are connected together at node A. The output is taken from the series connection at node B. Invertors 6 and 8 are merely repetitions of the invertor circuit defined by transistors 2 and 4 shown in logical symbol format for clarity. Invertor 6 can represent the output stage of a register or latch which can be directly controlled by signals external to the integrated circuits. Invertor 8 can represent the input stage of a register or latch which has an externally observable output.

Under normal, non-fault conditions when the output of previous invertor stage 6 is high, i.e. at approximately Vcc, very little current, $I_{IN}$ flows. Node A remains at the same high potential, keeping PMOS transistor 2 in an off state; hence $I_D$ is very low, and restricted to the leakage current of the PMOS transistor. Similarly, when the output of invertor 6 is low, i.e. at approximately $V_{SS}$ or OV, $I_{IN}$ is very small. Node A is held low, keeping NMOS transistor 4 in an off state; hence, $I_D$ is very low and restricted to the leakage current of the NMOS transistor. Hence, in such a circuit, regardless of the logic state, the quiescent current should be very low. For a typical integrated circuit with ten thousand invertors, the total quiescent current, $I_{CCQ}$, should be in the range of microAmps, for a no-fault situation.

Under normal non-fault quiescent conditions, the sum of the $I_D$ and $I_{IN}$ current is typically in the range of a few tenths of nanoAmps. The sum of all the $I_D$ currents for all the circuits in a given integrated circuit is known as the ICC current; and in the quiescent or steady state is known as the $I_{CCQ}$ current.

FIG. 2 illustrates the same circuit as FIG. 1 having a common fault condition which can be detected by traditional $I_{CCQ}$ testing. The fault is caused by undesirable resistive element 10 causing a partial short between node A of the circuit and the Vss supply line. Resistive element 10 could be caused by imperfections in the silicon structure, or by contamination of the structure during processing for example. The partial short caused by resistive element 10 creates a current path between node A and Vss, thus causing excessive $I_{IN}$ current flow. The partial short also tends to pull node A low, thus allowing PMOS transistor 2 to turn on. This results in a large $I_D$ current flow. Rather than a quiescent current range in the nanoAmps, the fault illustrated in FIG. 2 results in a quiescent current in the range of hundreds of microAmps or milliAmps. This type of fault can easily be detected by conventional $I_{CCQ}$ testing methods. A partial short between a node and the Vcc power supply results in the same level of anomalous quiescent current and is hence also readily detectable. Therefore in the case of a fault condition caused by a short or partial short between a node and a power supply, $I_{CCQ}$ testing methods can detect the fault by detecting excessive current flow.

With the rapidly increasing density of circuitry on modern ICs, many of which are inaccessible to the external pins, improved techniques are required to test and detect stuck node faults. Conventional $I_{CCQ}$ testing fails to detect nodes which have lost their connection to Vcc or Vss. A method of discharging these nodes is needed in order to detect this class of faults.

SUMMARY OF THE INVENTION

A method for fault testing an integrated circuit formed on a wafer includes loading a series of test vectors into latches of the integrated circuit, and allowing the circuit to reach a quiescent state. The integrated circuit is then momentarily illuminated with a light source. The $I_{CCQ}$ current is next measured and this measured current value is compared to a nominal current value for a functional circuit. Measured $I_{CCQ}$ current which is greatly in excess of the nominal current indicates a fault condition in the integrated circuit. An advantage of this invention is that it allows open circuit faults to be detected which are otherwise not detectable using conventional $I_{CCQ}$ test methods.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
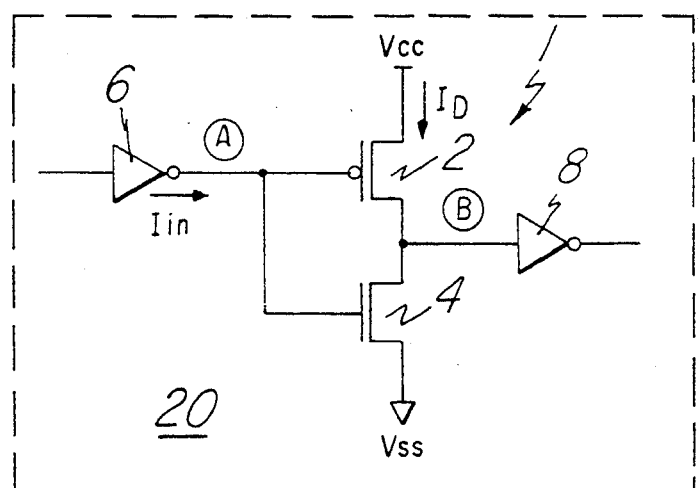
FIG. 1 is a schematic diagram of a prior art CMOS invertor circuit.
Figure 2:
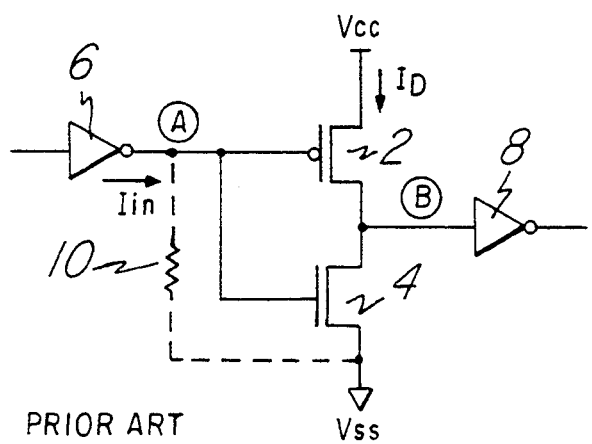
FIG. 2 is a schematic diagram of the prior art CMOS circuit of FIG. 1 having a partial short circuit fault.
Figure 3:
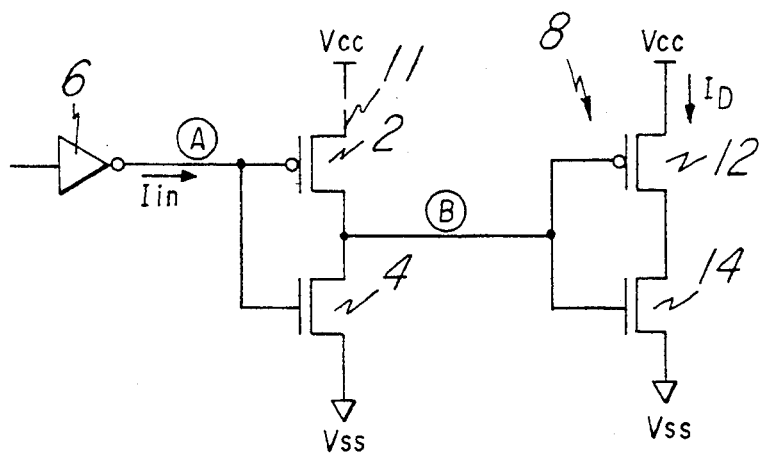
FIG. 3 is a schematic diagram of a the CMOS circuit of FIG. 1 having an open circuit fault.

FIG. 3 illustrates the CMOS invertor circuit of in FIGS. 1 and 2 with invertor 8 in schematic form rather than in its logical symbol form in order to aid the following discussion. The fault in FIG. 3 is caused by an open circuit in line 11, which normally connects PMOS transistor 2 to the Vcc power supply. Examples of defects causing such a fault include a defect or void in the metal interconnection between the circuit elements, or by a defect in the contact region between the elements and the metal interconnections. Other defects can also cause open circuit faults in semiconductor circuits. This type of fault cannot be detected using traditional $I_{CCQ}$ testing methods because the open circuit in line 11 prevents $I_D$ current flow through PMOS transistor 2.

Figure 4:
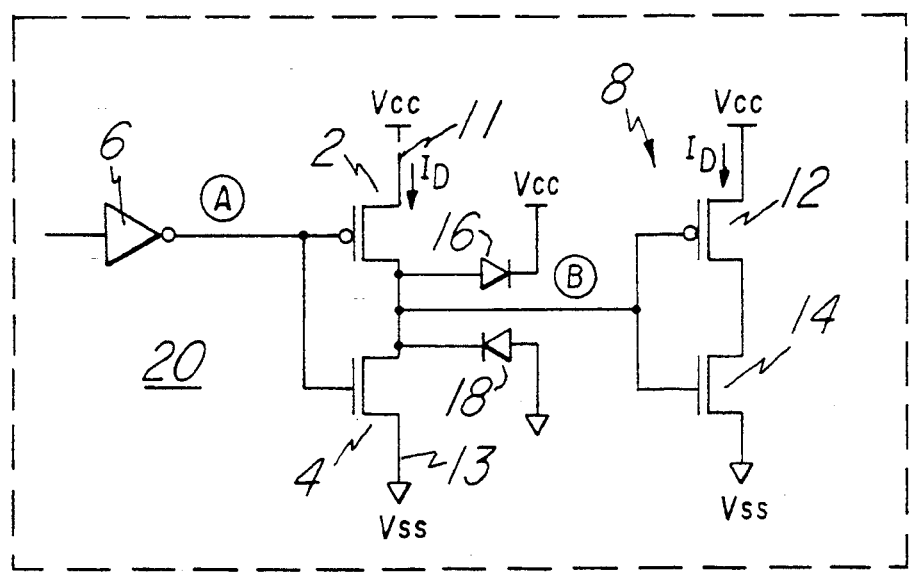
FIG. 4 is a schematic diagram of the CMOS circuit of FIG. 3 showing light induced currents in diode effects.

FIG. 4 illustrates schematically, the circuit of FIG. 3, having the open circuit fault in line 11, when the circuit is exposed to illumination in accordance with the preferred embodiment method of the invention. Illumination induces hole-electron pair currents in the semiconductor material, as illustrated schematically by diode 16, which allows current to flow from Vcc to node B, and diode 18, which allows current to flow from node B to Vss. It is important to note that light isolation is traditionally required for testing semiconductor integrated circuit wafers for exactly this reason. Under normal testing conditions, the wafer must not be exposed to illumination, because the light-induced current will mask the circuit's normal operations. Therefore, the prior art teaches that light isolation is essential for testing integrated circuit wafers. However, as discussed above, the prior art cannot detect a fault such as illustrated in FIGS. 3 and 4.

In FIG. 4, diodes 16 and 18 tend to drive node B to a potential of approximately Vcc/2, for the typical case of Vss being 0V. This is because diodes 16 and 18 form a simple voltage divider circuit, both of the diodes having approximately equal characteristics. When node B is held at Vcc/2 because of diodes 16 and 18, invertor stage 8 will have excessive $I_D$ current. This is because holding node B at the intermediate level of Vcc/2 allows both PMOS transistor 12 and NMOS transistor 14 to turn partially on, thus allowing a direct current path from Vcc to Vss. This results in excessive $I_D$ current which can be detected. Once the illumination is terminated, node B remains at approximately $V_{CC}/2$ for a relatively long period of time because of the capacitance of the node, and the low quiescent $I_{IN}$ current of invertor stage 8. Therefore, the excessive current caused by the fault will continue for a period after illumination is terminated.

Note that if there was no open fault in line 11, node B would be held to approximately $V_{CC}$ by PMOS transistor 2. In this case, PMOS transistor 12 of invertor stage 8 would be held in an off state, and thus no excessive $I_D$ current would flow or be detected.

By using illumination to induce photo-currents through diodes 16 and 18, the open circuit fault can be detected by its measured effect on the $I_D$ current of following invertor stage 8. This improved $I_{CCQ}$ technique which allows detection of an otherwise undetected fault also allows an open circuit fault in line 13 connecting transistor 4 and the Vss power supply.

Figure 5A:
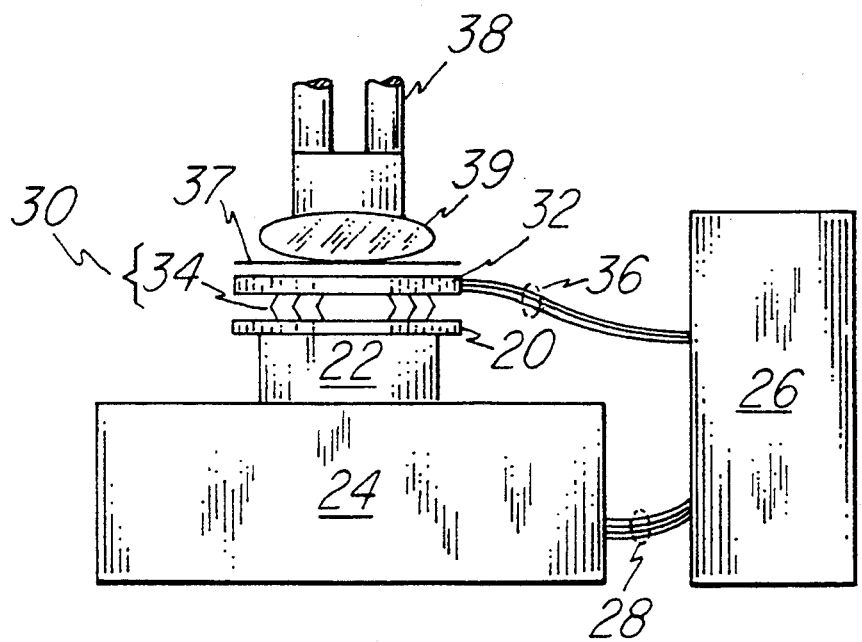
FIG. 5a is a block diagram of a testing system for use in the $I_{CCQ}$ testing method and FIG. 5b illustrates one embodiment if card 32.
Figure 5B:
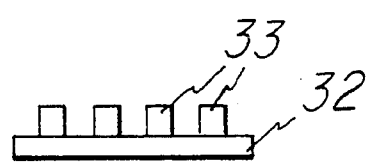

FIG. 5a illustrates in block form a test apparatus for realizing the advantageous testing method. In FIG. 5a wafer 20 is preferentially vacuum mounted on a chuck 22, which is part of wafer probe handler 24. Wafer probe handler can be of any type commonly available in the market such as an Electroglas 2001. Prober 24 is connected to tester 26 via. cables 28. Tester 26 provides instructions for loading, aligning and moving wafers to prober 24. Also attached to prober 24 is probe card 30, which consists of a card 32 on which are mounted probes 34. Card 32 may also preferentially have mounted on it circuit elements 33 such as test loads, switches, and storage registers, which are used in testing the integrated circuits formed on wafer 20 as illustrated in FIG. 5b. Test program vectors are applied to the integrated circuits from tester 26 via cables 36 connecting tester 26 to probe card 30. Card 32 is positioned over wafer 20 such that probes 34 align with preselected areas on an integrated circuit to be tested. Probes 34 align with bonding pads on the integrated circuit as well as with test points internal to the circuit. Once the probes 34 are aligned, card 32 is lowered until the probes 34 contact the integrated circuit. Oculars 38 are also provided on prober 24 to allow an operator to visually align the probes 34 over the integrated circuit although typically, Prober 24 allows for auto-alignment. prober 24 also comprises a light shield 37 which covers probe card 30 and wafer 20 during test in order to prevent the light-induced currents discussed above in reference to FIG. 4, when such currents are not desired. Lastly, prober 24 includes illumination source 39 which is positioned to illuminate wafer 20 including the various integrated circuits discussed above. Illumination source 39 is preferentially a conventional direct current incandescent bulb that provides a strong uniform light. The illumination source 39 may comprise a laser.

Figure 6:
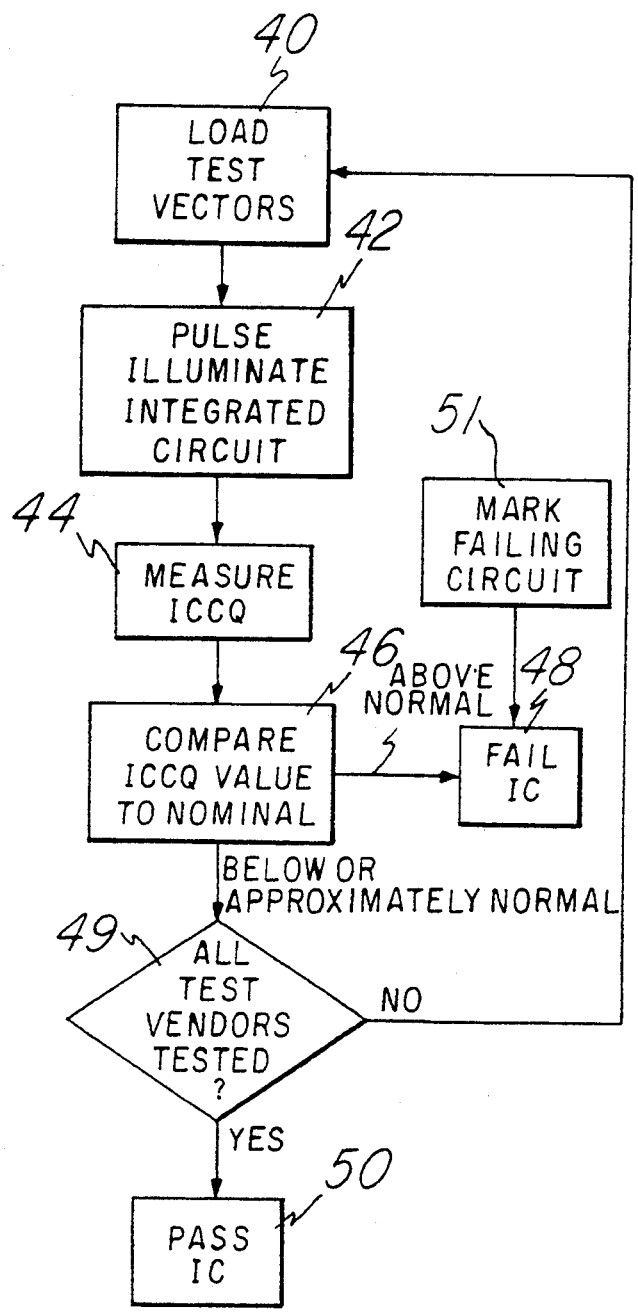
FIG. 6 is a block diagram illustrating steps of the preferred embodiment method.

FIG. 6 illustrates a flowchart describing the preferred embodiment method of testing for a circuit fault of the type illustrated in FIG. 3, using the system of FIG. 5a. In step 40, test vectors are loaded from tester 26 of FIG. 5a to the integrated circuit under test of wafer 20. These test vectors force the latches of the integrated circuit under test to a steady state of either logical high or low. These latches could be represented by invertors 6 and 8 as discussed above in reference to FIG. 1. It is important that the integrated circuit be static before proceeding with the test, that is there can be no floating or precharged dynamic nodes in the circuit. In step 42 the wafer is illuminated by a pulse from illumination source 39 of prober 24. Typically about one millisecond is sufficient. $I_{CCQ}$ is measured in step 44, immediately after illumination is terminated, and this measured value is compared to a known nominal quiescent value in step 46. If the measured $I_{CCQ}$ current is below or near the nominal value and the decision in step 49 indicates all test vectors have been tested, then the circuit passes the test in step 50. Other tests can be performed on the circuit if $I_{CCQ}$ is below the nominal value, but not all test vectors have been tested. As detailed above, an excessive $I_{CCQ}$ current is indicative of a fault in the circuit, hence, if the measured value greatly exceeds the nominal value the circuit fails the test in step 48. In step 57 the circuit is preferentially marked in some way to indicate its failing status. The circuit could be physically marked with an ink dot which indicates its status. Alternatively, the location of the integrated circuit on the wafer could be noted and stored in a memory map stored in tester 26, the memory map providing location data of the good and failing integrated circuits in later assembly operations.

The improved testing method herein described provides the novel advantage of detecting open circuit faults by their influence on $Icc_Q$. Furthermore, the improved method is the first method to use illumination of an integrated circuit to detect fault conditions. It is important to note that the prior art teaches away from this method because light isolation is traditionally required for testing semiconductor integrated circuits.

Although the invention has been described in relation to a preferred embodiment, the scope of the invention also comprehends different embodiments from those described. For instance, the illustrated CMOS invertor circuit can be replaced with various logic of circuits which are adaptable to $I_{CCQ}$ testing methods. The technique is not limited to CMOS technology, but could apply to bipolar and other types of semiconductor technology including GaAs as well. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of testing an integrated circuit formed on a wafer, comprising the steps of:
    loading a test vector into said integrated circuit;
    allowing said integrated circuit to reach a steady state;
    illuminating said integrated circuit with a light source;
    terminating said illumination and immediately measuring an $I_{CCQ}$ current in said integrated circuit; and
    comparing said measured Icco current to a nominal value.

2. The method of claim 1, wherein said light source comprises a direct current incandescent lamp.

3. The method of claim 1, wherein said light source comprises a laser.

4. The method of claim 1, wherein said test vector is serially scanned into said integrated circuit.

5. The method of claim 1, wherein said steps are repeated for a plurality of test vectors.

6. The method of claim 1 wherein said quiescent state comprises a logical high state.

7. The method of claim 1 wherein said quiescent state comprises a logical low state.

8. The method of claim 1 wherein said illuminating step comprises illuminating said integrated circuit with a pulse with a duration of about one millisecond.

9. The methods of claim 1 and further comprising the step of marking said integrated circuit to indicate a test status.

10. The method of claim 9 wherein said marking step comprises physically marking said integrated circuit with an ink dot.

11. The method of claim 9 wherein said marking step comprises storing said test status in a memory map.

12. The method of claim 1 wherein said integrated circuit comprises a CMOS circuit.

13. A method of testing an integrated circuit for faults, comprising the steps of:
    exposing said integrated circuit to a light source, said light source illuminating said integrated circuit and producing an $I_{CCQ}$ current within said integrated circuit;
    prohibiting said light source from illuminating said integrated circuit; and
    immediately after said prohibiting step, measuring said $I_{CCQ}$ current within said integrated circuit.

14. The method of claim 13, wherein said light source is a direct current incandescent lamp.

15. The method of claim 13, wherein said light source is a laser.

16. The method of claim 13 and further comprising the step of loading a test vector to said integrated circuit prior to said exposing step.

17. The method of claim 13 wherein said exposing step comprises exposing said integrated circuit with a pulse with a duration of about one millisecond.

18. The method of claim 13 wherein said integrated circuit comprises a CMOS circuit.

19. The method of claim 13 and further comprising the step of marking said integrated circuit to indicate a test status.

20. A system for testing an integrated circuit formed on a wafer comprising:
    circuitry for loading a test vector into said integrated circuit such that said integrated circuit reaches a steady state;
    a direct current incandescent lamp for illuminating said integrated circuit;
    means for terminating said illuminating; and
    apparatus for measuring $I_{CCQ}$ current in said integrated circuit.

21. The system of claim 20 and further comprising a chuck, said wafer mounted on said chuck.

22. The system of claim 20 wherein said apparatus for measuring comprises a probe card.

23. The system of claim 22 wherein said circuitry for loading comprises a tester which is coupled to said probe card via at least one cable.

24. The system of claim 20 wherein said integrated circuit comprises a CMOS integrated circuit.

25. The system of claim 20 and further comprising circuitry for comparing said measured $I_{CCQ}$ to a selected current value to determine a test status.

26. A test apparatus for testing an integrated circuit formed on a semiconductor wafer comprising:
    a wafer probe handler including a chuck, said wafer mounted on said chuck;
    a tester coupled to said wafer probe handler by at least one cable;
    a probe card attached to said wafer probe handler, said probe card including a card and probes which are aligned with pre-selected areas on said wafer;
    a light source for illuminating said integrated circuit;
    a light shield for preventing light from said light source from reaching said integrated circuit wherein said tester is capable of measuring an $I_{CCQ}$ current in said integrated circuit immediately after an illumination of said integrated circuit is terminated; and
    circuitry for comparing said measured $I_{CCQ}$ current to a selected current value to determine a test status.

27. A method of testing an integrated circuit formed on a semiconductor wafer, said integrated circuit including a plurality of devices, said method comprising the steps of:
    loading a test vector into said integrated circuit;
    allowing said integrated circuit to reach a steady state;
    simultaneously illuminating each of said devices on said integrated circuit;
    terminating said illumination and immediately measuring an $I_{CCQ}$ current in said integrated circuit; and
    comparing said measured $I_{CCQ}$ current to a nominal value.

28. The method of testing a transistor device formed on an integrated circuit, said method comprising the steps of:
    allowing said transistor device to reach a steady state;
    illuminating said transistor device;
    terminating said illuminating step and immediately measuring an $I_{CCQ}$ current in said transistor device; and
    comparing said measured $I_{CCQ}$ current to a nominal value.

29. The method of claim 28 wherein said transistor device comprises a CMOS inverter.

30. The method of claim 28 wherein said illuminating step is performed with an incandescent lamp.

31. The method of claim 28 wherein said illuminating step is performed with a lamp.

* * * * *